United States Patent [19]

McDonnell et al.

[11] Patent Number: 5,241,265
[45] Date of Patent: Aug. 31, 1993

[54] LOGIC FUNCTION CIRCUIT WITH AN ARRAY OF DATA STORES AND THEIR CIRCUIT TESTING

[75] Inventors: Michael J. McDonnell, Woodlawn; Aris Tombul, Ottawa, both of Canada

[73] Assignee: Northern Telecom Limited, Montreal, Canada

[21] Appl. No.: 858,293

[22] Filed: Mar. 26, 1992

[51] Int. Cl.$^5$ .................................................. G01R 31/28
[52] U.S. Cl. .............................. 324/158 R; 324/73.1; 371/22.3
[58] Field of Search .................. 324/158 R, 73.1; 371/15.1, 25.1, 16.1, 22.1, 22.3, 22.6; 307/602, 571, 572

[56] References Cited

U.S. PATENT DOCUMENTS 4,879,718 11/1989 Sanner ................................ 371/22.3
4,972,144 11/1990 Lyon et al. ..................... 324/158 R Primary Examiner—Vinh Nguyen
Attorney, Agent, or Firm—John E. Mowle

[57] ABSTRACT

A logic function circuit has M columns of N series-connected flip-flops, M logic circuits and M multiplexers. Each logic circuit and multiplexer are associated with a respective column. The multiplexers determine operation and test modes. In the operation mode, each logic circuit acts on data from the Nth row flip-flop and a multiplexed input signal, and its logic result data is latched into the first row flip-flop of the respective column. In the test mode, a scan data stream of M×N bits is transferred through the M×N flip-flops and stored therein. Thereafter, a test data bit, instead of the input data signal, is fed to the logic circuits. By verifying the logic result data based on the latched scan data and the test data, it can be determined whether the logic circuits and the flip-flops are functioning properly. Since only one multiplexer for mode selection and one logic circuit is required for each column of flip-flops, a greater number of flip-flops can be fabricated in a limited area on one chip.

6 Claims, 4 Drawing Sheets

LOGIC FUNCTION CIRCUIT WITH AN ARRAY OF DATA STORES AND THEIR CIRCUIT TESTING

TECHNICAL FIELD

The present invention relates to a logic function circuit and method for testing the logic function circuit.

BACKGROUND ART

A quad transceiver, included in a DS1 interface telecommunications facility, receives an 8.192 Mbps data stream converted from four 1.544 Mbps data streams. One of the processing functions of the transceiver is input bit counting. Usually, the counter portion is formed on one chip device and the chip includes test function circuitry.

FIGS. 1A and 1B show a related art logic function circuit, which can be applied to such a counter portion with test function. The logic function circuit comprises $M(=4)$ columns and $N(=4)$ rows of logic circuits and flip-flops. Each logic circuit has an AND gate and an exclusive OR (XOR) gate to form a binary counter. Each row circuitry is connected so as to form a hexadecimal ($2^4$) counter which separately counts the pulses of an input signal CI1, CI2, CI3 or CI4. Also, a multiplexer for mode selection is included between the respective logic circuit and flip-flop. The Q output terminal of each flip-flop is connected to an I1 input terminal of the respective multiplexer of the succeeding row. As well, the Q output terminal of each flip-flop of the fourth row is connected to the I1 input terminal of the first row multiplexer of the succeeding column. Clock pulses CLOCK are commonly fed to the clock input terminals of all flip-flops.

(i) OPERATION MODE

When a mode selection signal MS on a mode line 11 is logic "0", all multiplexers M11-M14, M21-M24, M31-M34 and M41-M44 select their I0 input terminals. The output signal from the XOR gate of each logic circuit is fed to the D input terminal of the associated flip-flop through the multiplexer. At the same time, the carry-out signal from the AND gate of each logic circuit is fed to the XOR gate of the succeeding logic circuit in that row. The output signal of each flip-flop is also fed to the XOR and AND gates of the associated logic circuit and to the AND gate of the succeeding logic circuit in that row. As a result, in response to the clock pulses CLOCK, the first, second, third and fourth row circuitry form identical hexadecimal counters to count pulses of input signals CI1, CI2, CI3 and CI4, respectively, on input lines 131-134. The hexadecimal counters provide carry-out signals CA1, CA2, CA3 and CA4 on output lines 151, 152, 153 and 154, respectively. Each hexadecimal counter provides its 4-bit logic states CO11, CO12, CO13, and CO14: CO21, CO22, CO23, and CO24: CO31, CO32, CO33, and CO34: and CO41, CO42, CO43, and CO44.

(ii) TEST MODE

In order for the logic function circuit to be in a test mode, the mode selection signal MS on the mode line 11 is switched to logic "1", so that all the multiplexers select their I1 input terminals. In the test mode, the output signal from each flip-flip is fed to the D input terminal of the succeeding flip-flop of that column through the multiplexer. Also, the output signal from each fourth row flip-flop is fed to the D input terminal of the first row flip-flop of the succeeding column.

A 16-bit data stream of a scan-in signal SI on a scan line 17 is provided to the flip-flop F11 through the multiplexer M11. In response to the clock pulses CLOCK, the 16-bit data stream of the scan-in signal SI is transferred through the flip-flops and its data is latched therein.

Thereafter, the logic state of the mode selection signal MS on the mode line 11 transits from "1" to "0". Accordingly, all multiplexers switch their selection to the I0 input terminals. 1-bit input signals CI1, CI2, CI3 and CI4 on the input lines 131-134 are provided. Each logic circuit acts on the 1-bit input signal data, the output data from the preceding logic circuits in that row, and the scanin signal SI bit data, which was latched into the associated flip-flop from the 16-bit data stream of the scan-in signal SI. The logic result of each logic circuit is latched to the associated flip-flop in response to the clock pulse CLOCK.

Thereafter, the logic state of the mode selection signal MS on the mode line 11 transits from "0" to "1". Another 16-bit data stream of scan-in signal SI on the scan line 17 is provided. In response to the clock pulses CLOCK, a bit stream of all resulting data latched into the flip-flops is read out in series from the output terminal of the flip-flop F44 at the fourth row and fourth column, and at the same time, the 16-bit data stream of the scan-in signal SI is transferred through the flip-flops and its data is latched therein.

Thereafter, the logic state of the mode selection signal MS on the mode line 11 is switched to "0". Again, 1-bit input signals CI1, CI2, CI3 and CI4 are provided to the input lines 131-134. Each logic circuit acts on another data, and its logic result is latched to the associated flip-flop in response to the clock pulse CLOCK.

Thereafter, the logic state of the mode selection signal MS on the mode line 11 transits to "1", and another 16-bit data stream of the scan-in signal SI is provided onto the scan line 17. In response to the clock pulses CLOCK, a stream of all the resulting data latched in the flip-flops is read out in series.

By repeating such steps and monitoring the resulting data which is read out from the flip-flop F44, it is possible to determine whether the logic circuits and flip-flops are operating properly.

In the related art logic function circuit, one multiplexer is required for testing each associated fli-flop. As a result, as many multiplexers are required as logic circuits and flip-flops.

SUMMARY OF THE INVENTION

The present invention provides apparatus with logic function circuits, data transfer latches and test multiplexers, which can be embedded into a relatively smaller chip.

Also, the present invention provides a method for easily testing the logic circuits and transfer latches.

According to the most general aspect of the present invention, a method for testing a plurality of logic circuits and a transfer latch array having M columns and N rows in which the output data from the logic circuits are stored, is characterized in that: the transfer latches in each of the M columns are connected in series, and there are M logic circuits, each logic circuit being associated with a respective one of the M columns of transfer latches. In the method, a first test signal of M×N series data bits is stored in the M×N transfer latches. Thereafter, a second test signal of at least one data bit is provided to each of the logic circuits, so that each logic circuit acts on the second test signal data. The logic result of each logic circuit is stored in the first one of the series-connected transfer latches in the associated column. The result of the data stored in the M×N transfer latches is successively transferred out. By monitoring the logic results of the M logic circuits, it is possible to determine whether the logic circuits and the transfer latches are functioning properly.

In another aspect of the present invention, an apparatus comprises a plurality of logic circuits and a transfer latch array having M columns and N rows in which the output data from the logic circuits is stored, both M and N being integers greater than one. The transfer latches in each column are series-connected, so that the output signal from each transfer latch transfers to the succeeding transfer latch in that column. The number of the logic circuits is M, each of the M logic circuits being associated with a respective one of the M columns of transfer latches. The apparatus also comprises: M multiplexers, each multiplexer being associated with a respective one transfer latch column and associated logic circuit; means for setting first and second operational states of the M multiplexers; and means for providing a first test signal. In the apparatus, each multiplexer transfers the output signal from the associated one of the M logic circuits to the first one of the series-connected transfer latches in the respective one of the M columns in the first operational state of the multiplexer. The first multiplexer in the first column transfers the first test signal to the first transfer latch in the second operational state. The remaining multiplexers transfer the output signal of the last one of the series-connected transfer latches of the preceding column to the first transfer latch of its associated column in the second operational state.

The apparatus may further comprise: means for coupling the output signal of the last one of the series-connected transfer latches to the associated one of the M logic circuits; and means for providing a second test signal to the M logic circuits when the multiplexers are switched back to the first operational state from the second operational state. In the apparatus, the logic result of the first test signal data stored in the last one of the series-connected transfer latches in the associated column and the second test signal data from each logic circuit is provided to the first one of the series-connected transfer latches in the associated column. When the M multiplexers are in their second operational state, the first test signal of M×N data is transferred through the array of M×N transfer latches and the data is stored therein. Subsequently, the operational state of the M multiplexers is switched to the first one. The second test signal of one bit, for example, is then provided to the M logic circuits. Also, the output signal (or the first test signal data stored in the transfer latch) from one of the series-connected transfer latches, is provided to the logic circuits. Each multiplexer provides the first one of the series-connected transfer latches in the respective one of the M columns with the logic result on the basis of the first and second test signal data. By repeating the test with numerous data patterns of the first test signals, it is possible to determine whether the logic circuits and the transfer latches function properly.

When it is determined that the logic circuits and transfer latches function properly, the apparatus may operate in the first operational state only. Responding to actual input data being fed to the logic circuits, instead of the second test signal, they provide the logic results to the first transfer latch of each column.

Since only one multiplexer and one logic circuit is required for each column of N series-connected transfer latches (as opposed to one multiplexer and one logic circuit for each transfer latch as illustrated in the related art), a larger number of transfer latches (e.g. flip-flops) can be fabricated within the same area of a chip.

BRIEF DESCRIPTION OF THE DRAWINGS

An embodiment of the present invention will now be described by way of example only with reference to the accompanying drawings in which.

BEST MODE FOR CARRYING OUT THE INVENTION

Figure 1A:
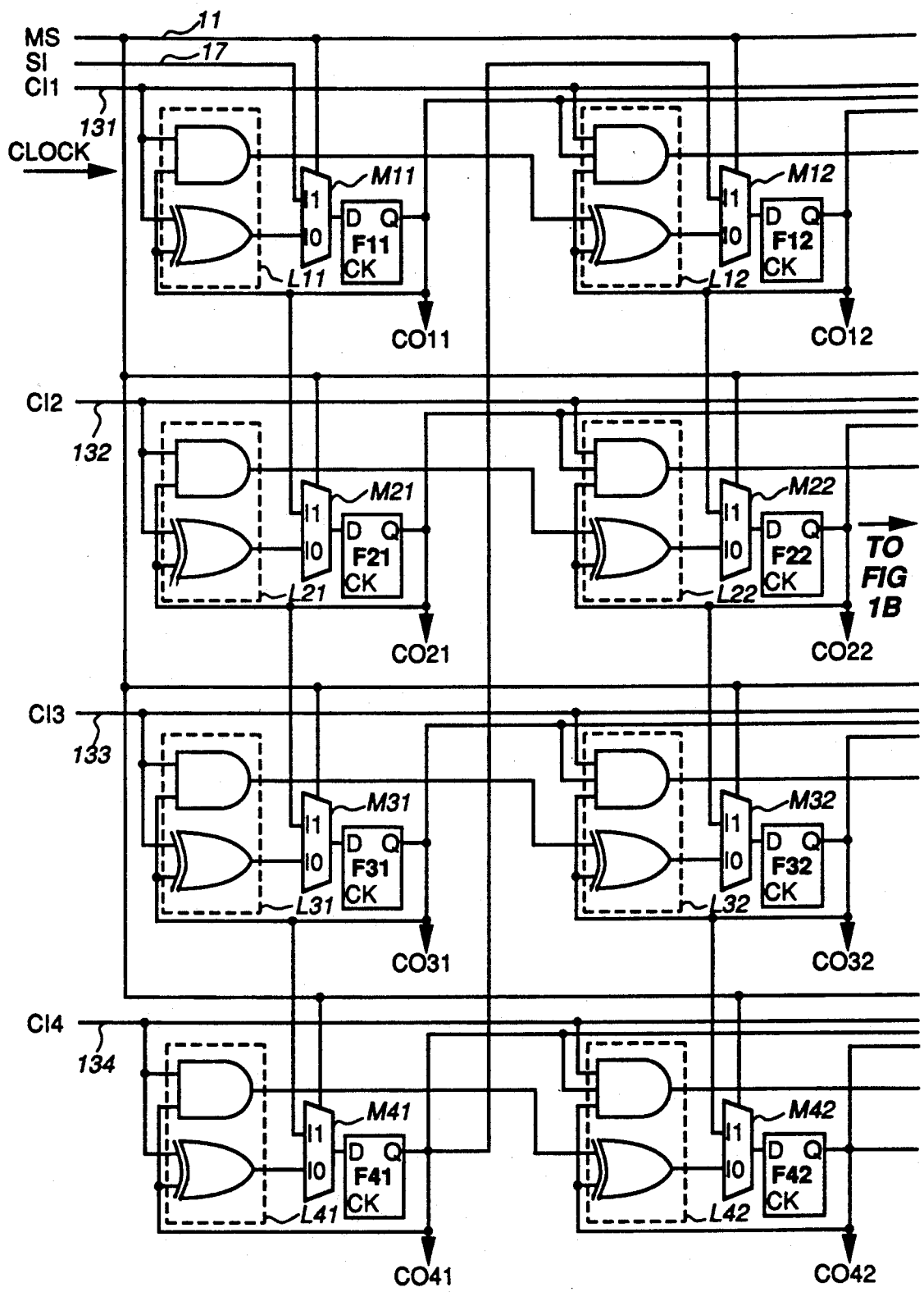
FIGS. 1A and 1B are block diagrams of a related art logic function circuit.
Figure 1B:
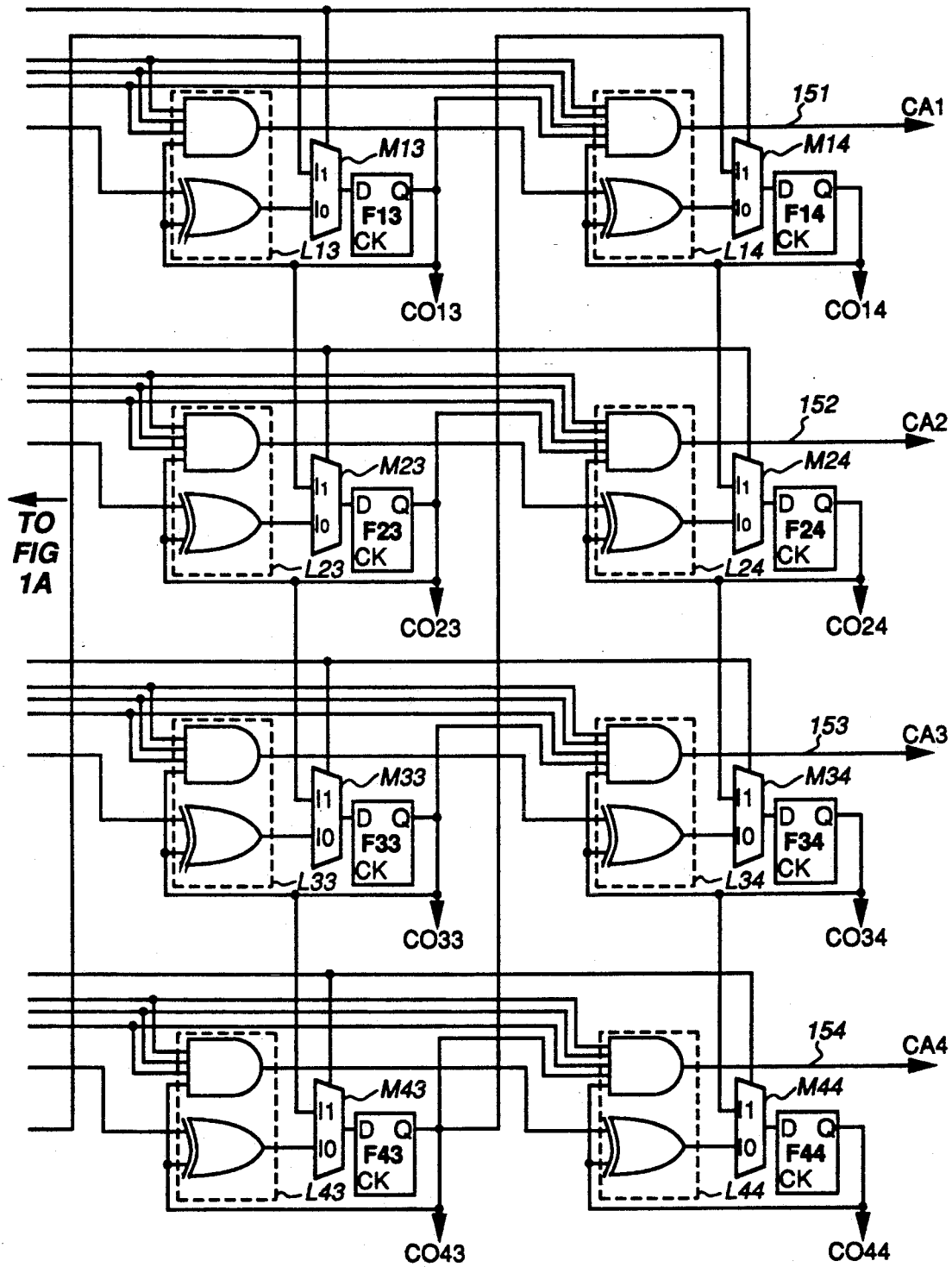
Figure 2A:
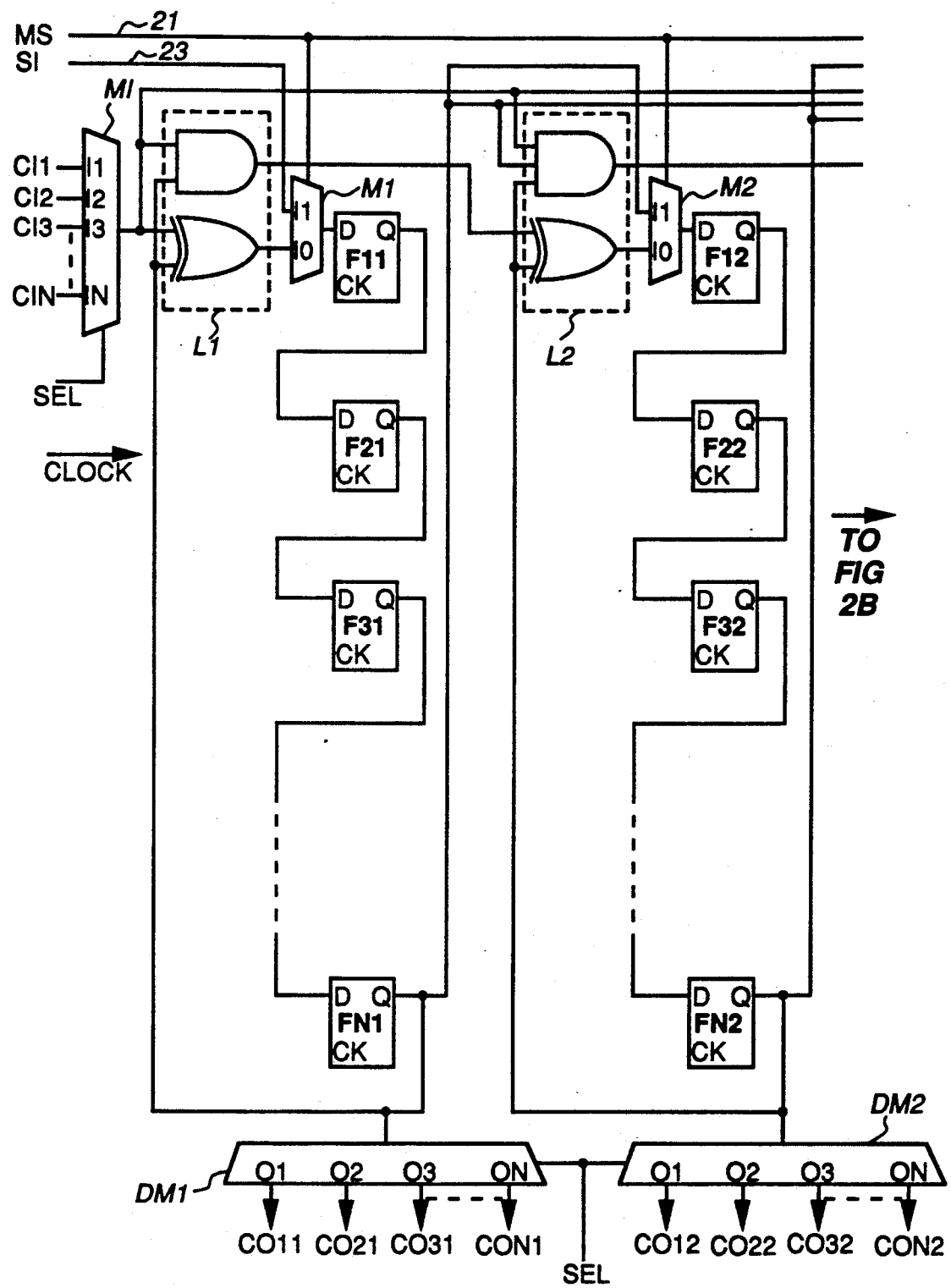
FIGS. 2A and 2B are block diagrams of a preferred embodiment of a logic function circuit according to the present invention.
Figure 2B:
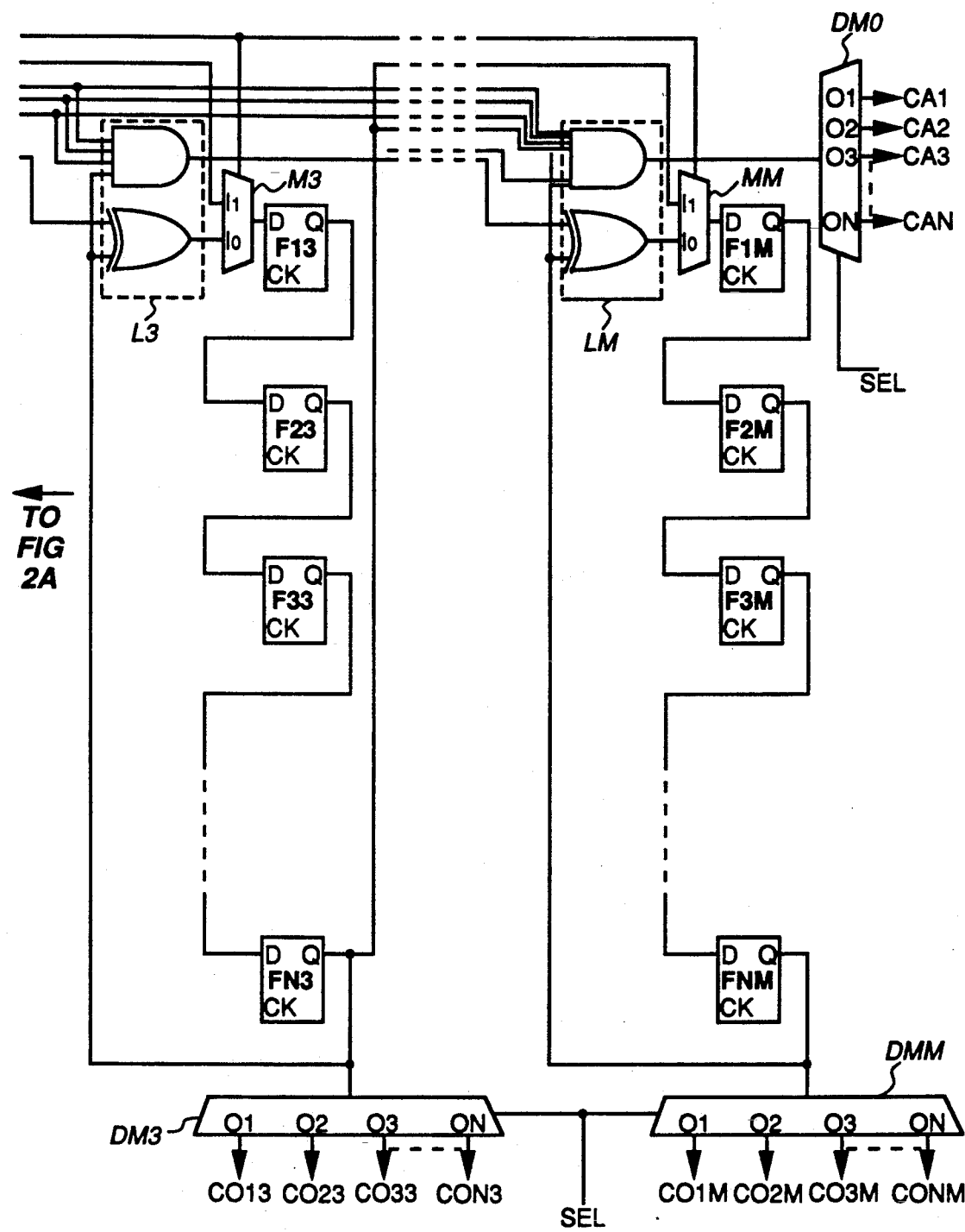

The logic function circuit according to the present invention, shown in FIGS. 2A and 2B, is applied to a counter of a quad transceiver (not shown). The logic function circuit receives N input signals CI1, CI2, CI3, - - -, and CIN, which have different pulse timing from each other so as to be multiplexed. The logic function circuit comprises a flip-flop array having M column and N rows, both M and N being integers greater than one. In each column, the Q output terminal of the flip-flop is connected to the D input terminal of the succeeding flip-flop, so that the N flip-flops are connected in series. Hence, there are M columns of the N-series-connected flip-flops. Clock pulses CLOCK are commonly fed to the clock input terminals CK of all flip-flops. Also, the logic function circuit comprises M logic circuits L1-LM, each of which is associated with the first row flip-flop of one of the M columns. Each of the logic circuits includes an AND gate and an exclusive OR (XOR) gate which together form a binary counter. Furthermore, the logic function circuit comprises M multiplexers M1-MM, each of which is associated with the respective first row flip-flop and logic circuit.

A mode line 21 is commonly connected to the selection terminals of the M multiplexers M1-MM. The output terminal of the XOR gate of each logic circuit is connected to an I0 input terminal of the associated multiplexer. The output terminal of each multiplexer is connected to the D input terminal of the associated flip-flop. The output terminal of the AND gate of that logic circuit is connected to the XOR gate of the succeeding logic circuit. The Q output terminal of the Nth row flip-flop of each column is connected to: (i) both XOR and AND gates of the logic circuit of that column; (ii) the I1 input terminal of the multiplexor of the succeeding column; and (iii) the AND gates of all succeeding logic circuits. A scan line 23 is connected to the I1 input terminal of the first multiplexer M1.

N input signals CI1, CI2, CI3, - - -, and CIN are fed to an input multiplexer MI, whose output signal with respect to a selection signal SEL is fed to both XOR and AND gates of the first logic circuit L1 and to the AND gates of all other logic circuits L2-LM. The selection signal SEL is synchronized with the clock pulses CLOCK. The output terminal of the AND gate of the logic circuit LM of the Mth column is connected to an output demultiplexer DMO, which provides a carry-out signal CA1, CA2, CA3, - - -, or CAN, in response to the selection signal SEL.

The output terminal of the Nth flip-flop of each column is also connected to a respective one of demultiplexers DM1-DMM, to which the selection signal SEL is commonly fed.

(i) OPERATION MODE

When the mode selection signal MS on the mode line 21 is logic "0", the multiplexers M1-MM select their I0 input terminals.

The logic state of the selection signal SEL is set so that the input multiplexer MI selects the input signal CI1 and is fed to all logic circuits L1-LM. The XOR gate of the first logic circuit L1 processes an exclusive OR logic of data of the input signal CI1 and data latched in the Nth flip-flop FN1. Likewise, each XOR gate of the other logic circuits processes an exclusive OR of two data, one of them being latched in the Nth flip-flop of that column and the other being the carry-out data from the AND gate of the logic circuit of the preceding column. At the same time, the AND gate of each logic circuit processes an AND logic of: (i) the data of the input signal CI1; (ii) the data latched in all Nth flip-flops of the preceding columns; and (iii) the data latched in the Nth flip-flop of that column. Each exclusive OR result of the logic circuit is transferred through the associated multiplexer to the D input terminal of the first row flip-flop and is latched therein in response to the clock pulse CLOCK. M-bit count results of the input signal CI1 are stored in the first row flip-flops F11-F1M.

The selection signal SEL changes its logic state so that the input multiplexer MI selects the input signal CI2 and is fed to all logic circuits L1-LM. Each logic circuit acts on (i) the data of the input signal CI2; (ii) data latched in all Nth flip-flops of the preceding columns; (iii) the carry-out data from the logic circuit in the preceding column; and (iv) the data latched in the Nth flip-flop of that column. Responding to the clock pulse CLOCK, the exclusive resulting data from the logic circuits L1-LM is latched into the first row flip-flops F11-F1M, respectively. At the same time, the data which was latched in each flip-flop is transferred to the succeeding flip-flop of that column and stored therein. As a result, the M-bit count results of the input signal CI1 are transferred from the first row flip-flops F11-F1M to the second row flip-flops F21-F2M and stored therein. The M-bit count results of the input signal CI2 are stored in the first row flip-flops F11-F1M.

By repeating the above operations with input signal selections by the selection signal SEL, each of the row circuitry form a $2^M$ counter to count pulses of input signals CI1, CI2, CI3, - - -, or CIN. The counter provides the carry-out signal CA1, CA2, CA3, - - -, or CAN, with respect to the selection signal SEL, and also provides its M-bit logic states CO11, CO12, CO13, - - - CO1M; CO21, CO22, CO23, - - -, CO2M; CO31, CO32, CO33, - - -, CO3M; - - -; and CON1, CON2, CON3, - - -, CONM.

(ii) TEST MODE

In order for the logic function circuit to be in the test mode, the mode selection signal MS on the mode line 21 is set to logic "1", so that all multiplexers select their I1 input terminals. In the test mode, the signal state of the selection signal SEL is constant so that the input multiplexer MI selects its I1 input terminal and the demultiplexer DMM selects its O1 output terminal. In the test mode, there are two tests for the flip-flops and the logic circuits.

(ii-1) Test for flip-flops

An $M \times N$-bit data stream of a scan-in signal SI which provides a first test signal is fed to the scan line 23. In response to $M \times N$ clock pulses CLOCK, the $M \times N$-bit data is fed to the flip-flop F11 through the multiplexer M1, transferring through the $M \times N$ flip-flops and latched therein. Thereafter, in response to the succeeding $M \times N$ clock pulses CLOCK, the $M \times N$-bit data latched in the $M \times N$ flip-flops is read out in series from the O1 output terminal of the demultiplexer DMM. If the bit pattern read out from the logic function circuit is the same as the bit pattern of the scan-in signal SI previously fed to the scan line 23, it is determined that all flip-flops fairly operate.

(ii-2) Test for logic circuits

A first $M \times N$-bit data stream of the scan-in signal SI is fed to the scan line 23 and latched in the $M \times N$ flip-flops, in response to the clock pulses CLOCK.

The logic state of the mode selection signal MS on the mode line 21 transits from "1" to "0", so that all multiplexers switch their selection from the I1 input terminals to the I0 input terminals. A 1-bit data of the input signal CI1 which provides a second test signal is fed to the input multiplexer MI The first logic circuit L1 acts on that 1-bit input data and the scan-in signal SI bit data, which was latched in the flip-flop FN1. In each of the other logic circuits L2-LM, the XOR gate processes an XOR logic of: (i) the scanin signal SI bit data, which was latched in the Nth row flip-flop of that column; and (ii) the carry-out bit data from the AND gate of the preceding column. The AND gate processes an AND logic of: (i) the 1-bit input data of the input signal CI1; (ii) the scan-in signal SI bit data latched in all Nth flip-flops of the preceding columns; and (iii) the data latched in the Nth flip-flop of that column. The XOR logic result of each logic circuit is latched in the first row flip-flop of the respective column, in response to the clock pulse CLOCK. At the same time, that clock pulse CLOCK causes the data latched in one flip-flop to be transferred to the succeeding flip-flop in that column.

The logic state of the mode selection signal MS on the mode line 21 is switched back to "1". With the clock pulses CLOCK, all data latched in the flip-flops are read out in series from the flip-flop FNM through the O1 output terminal of the demultiplexer DMM. The read out data includes the logic result data made by the logic circuits L1-LM. The read out data pattern is compared to a predetermined data bit pattern.

Likewise, a second $M \times N$-bit data stream of the scan-in signal SI is provided onto the scan line 23. The bit pattern of the second data stream is different from that of the first data stream. In response to the clock pulses CLOCK, the data is transferred and stored in the $M \times N$ flip-flops. Again, the logic state of the mode selection signal MS on the mode line 21 again transits from "1" to "0", and another 1-bit data of the input signal CI1 is provided. Each of the logic circuits L1-LM acts on that 1-bit data and the scan-in signal SI bit data latched in the Nth row flip-flops in the same manner as it did for the first data stream of the scan-in signal SI. The logic result data by the XOR gates of the logic circuits is latched in the first row of flip-flops, in response to the clock pulses CLOCK. Thereafter, the logic state of the mode selection signal MS on the mode line 21 transmits from "0" to "1", and with the clock pulses CLOCK, all data latched in the flip-flops is read out from the flip-flop FNM and is compared to the predetermined data bit pattern.

By repeating such steps with different patterns of the M×N bit data of the scan-in signal SI and comparing the read out data bit pattern to the predetermined data bit pattern, it is possible to determine whether or not the logic circuits L1–LM are functioning.

Since only one multiplexer and one logic circuit is required for each column of N series-connected transfer flip-flops, a greater number of flip-flops can be fabricated in a limited area. The operation test of the logic circuits and flip-flops can be made with much fewer multiplexers.

While the logic circuits described above are binary counters having XOR and AND gates, any other logic circuits (e.g. adder, another type counter), may be applied thereto. Also, the logic circuits can be a finite state machine with combinational logic circuits.

What is claimed is:

1. A method for testing a plurality of logic circuits and a plurality of M×N transfer latches forming a transfer latch array having M columns and N rows, both M and N being integers greater than one, characterized in that:
   the transfer latches in each one of the M columns are connected in series so that a data bit stored in a first one of the N transfer latches in each column in successively transferable through intermediate ones of the transfer latches to a last one of the N transfer latches in that column; and
   there are M logic circits, each logic circuit being associated with a respective one of the M columns of transfer latches,
   the method comprising the steps of:
   providing M×N data bits of a first test signal to the M×N transfer latches so that each one of the data bits is stored in a respective one of the M×N transfer latches;
   providing a data bit of a second test signal and the data bit from the first test signal stored in the last one of the transfer latches in the associated column to each of the logic circuits, so that each logic circuit acts on data bits of the first and second test signal to provide a logic value resulting from data of the first and second test signals;
   storing the logic value from each logic circuit in the first one of the transfer latches in the associated column; and
   successively transferring out the logic value stored in each of the first ones of the N transfer latches,
   whereby from the logic value of the M logic circuits, it can be determined whether the logic circuits and the transfer latches function properly.

2. A method according to claim 1, wherein the step of providing the M×N data bits of the first test signal to the M×N transfer latches, includes the step of transferring the first test signal to the first one of the N transfer latches of the first one of the M columns and coupling the data bit stored in the last one of the N transfer latches of each column to the first one of the transfer latches of the succeeding column.

3. A method for testing a plurality of logic circuits and a plurality of M×N transfer latches forming a transfer latch array having M columns and N rows, each logic circuit providing a logic value bit and a carry-out bit, both bits resulting from input data of the each logic circuit, the carry-out bit being fed to the succeeding logic circuit, both M and N being integers greater than one, characterized in that:
   the transfer latches in each one of the M columns are connected in series so that a data bit stored in a first one of the N transfer latches in each column is successively transferable through intermediate ones of the transfer latches to a last one of the N transfer latches in the column; and
   there are M logic circuits, each logic circuit being associated with a respective one of the M columns of transfer latches,
   the method comprising the steps of:
   providing a first test signal of at least M×N data bits to a first one of the N transfer latches in a first one of the M columns and transferring the data bit stored in a last one of the N transfer latches of each column to the first one of the N transfer latches of the succeeding column, so that the first test signal data is successively transferred through the M×N transfer latches and is stored therein;
   providing a data bit of a second test signal to each logic circuit, wherein the logic circuit acts on: (i) the data bit of the second test signal; (ii) the carry-out bit from the preceding logic circuit; and (iii) the data bit of the first test signal stored in each of the last ones of the N transfer latches of all preceding columns and its associated column to provide a logic value resulting from data of the first and second test signals;
   storing the logic result bit of each logic circuit in the first one of the N transfer latches in the associated column; and
   successively transferring out the logic value stored in the first one of the N transfer latches of each column,
   whereby from the logic value of the M logic circuits, it can be determined whether the logic circuits and the transfer latches function properly.

4. In an apparatus comprising a plurality of logic circuits and a plurality of M×N transfer latches forming a transfer latch array having M columns and N rows, each of the logic circuits providing a logic value resulting from input data thereof, both M and N being integers greater than one,
   the improvement which comprises:
   the transfer latches in each one of the M columns being connected in series, so that a data bit stored in a first one of the N transfer latches in each column is successively transferable through intermediate ones of the transfer latches to a last one of the N transfer latches in that column;
   the number of the logic circuits being M, each logic circuit being associated with a respective one of the M columns of transfer latches; and
   M multiplexers having first and second operational states, each of the M multiplexers being associated with a respective one of the M columns of transfer latches and associated logic circuit;
   in which:
   each one of the M multiplexers transfers the logic value provided from the associated one of the M logic circuits to the first one of the N transfer latches in the respective one of the M columns in the first operational state;
   the first one of the M multiplexers associated with the first one of the M columns transfers data of a first test signal to the first one of the N transfer latches of the first one of the M columns in the second operational state; and each of the remaining multiplexers transfers the data bit stored in the last one of the N transfer latches of the preceding column to the first one of the N transfer latches of its associated column in the second operational state.

5. An apparatus according to claim 4, in which:

the data bit stored in the last one of the N transfer latches is coupled to the associated one of the M logic circuits;

data of a second test signal is provided to the M logic circuits when the multiplexers are switched back to the first operational state from the second operational state; and a logic value resulting from the first test signal data stored in the last one of the N transfer latches in the associated column and the second test signal data from each logic circuit is provided to the first one of the N transfer latches in the associated column.

6. In an apparatus comprising a plurality of logic circuits and a plurality of $M \times N$ transfer latches forming a transfer latch array having M columns and N rows, each logic circuit providing a logic value bit and a carry-out bit, both bits resulting from input data of the each logic circuit, the carry-out bit being fed to the succeeding logic circuit, both M and N being integers greater than one, the improvement which comprises:

the transfer latches in each one of the M columns being connected in series, so that a data bit stored in a first one of the N transfer latches in each column is successively transferable through intermediate ones of the transfer latches to a last one of the N transfer latches in that column;

the number of the logic circuits being M, each logic circuit being associated with a respective one of the M columns of transfer latches;

M multiplexers having first and second operational states, each one of the M multiplexers being associated with a respective one of the M columns of transfer latches and associated logic circuit;

each one of the M multiplexers transferring the logic result bit from the associated one of the M logic circuits to the first one of the N transfer latches in the respective one of the M columns in the first operational state; and the data bit stored in the last one of the N transfer latches in each one of the M columns being provided to the associated one of the M logic circuits;

in which:

(a) in the second operational state, the first one of the M multiplexers associated with the first one of the M columns transfers a first test signal of $M \times N$ series data bits to the first one of the N transfer latches in that column; and each of the remaining multiplexers transfers the data bit stored in the last one of the N transfer latches of the preceding column to the first one of the N transfer latches of its associated column, so that the $M \times N$ bit series data of the first test signal is stored in the $M \times N$ transfer latches; and (b) in the first operational state after being switched back from the second operational state, a second test signal of at least one bit data being provided to the M logic circuits, each logic circuit acts on: (i) the data bit of the second test signal; (ii) the carry-out bit from the preceding logic circuit; and (iii) the data bit of the first test signal stored in the last ones of the N transfer latches of all preceding columns and its associated column to provide a logic value resulting from the carry-out bit and the date bits of the first and second test signals, wherein the logic result bit from each logic circuit is transferred to the first one of the N transfer latches in the associated column and stored therein.

* * * * *